United States Patent
Wu (10) Patent No.: US 9,273,761 B2
(45) Date of Patent: Mar. 1, 2016

(54) XYθ PRECISION ALIGNMENT PLATFORM

(71) Applicant: Mau-Hsiang Wu, Taichung (TW)

(72) Inventor: Mau-Hsiang Wu, Taichung (TW)

(*) Notice: Subject to any disclaimer, the term of this patent is extended or adjusted under 35 U.S.C. 154(b) by 396 days.

(21) Appl. No.: 13/935,562

(22) Filed: Jul. 5, 2013

(65) Prior Publication Data
US 2013/0291667 A1 Nov. 7, 2013

Related U.S. Application Data

(63) Continuation-in-part of application No. 13/584,833, filed on Aug. 14, 2012, now Pat. No. 9,032,832.

(30) Foreign Application Priority Data

May 3, 2012 (TW) .............................. 101208321 U (51) Int. Cl.
*F16H 19/02* (2006.01)
*B25B 11/00* (2006.01)
*G12B 5/00* (2006.01)
*H01L 21/68* (2006.01)

(52) U.S. Cl.
CPC ................. *F16H 19/02* (2013.01); *B25B 11/00* (2013.01); *G12B 5/00* (2013.01); *H01L 21/68* (2013.01); *Y10T 74/18792* (2015.01)

(58) Field of Classification Search
CPC .......... F16H 19/02; B25B 11/00; G12B 5/00; H01L 21/68; Y10T 74/18792
See application file for complete search history.

(56) References Cited

U.S. PATENT DOCUMENTS

| | | | | |
|---|---|---|---|---|
| 5,323,712 A * | 6/1994 | Kikuiri | ................... | B23Q 1/48 108/138 |
| 5,524,502 A * | 6/1996 | Osanai | ..................... | B23Q 1/38 108/141 |
| 5,982,132 A * | 11/1999 | Colby | .................... | H01L 21/68 269/71 |
| 7,243,571 B2 * | 7/2007 | Pahk | ....................... | B23Q 1/34 73/105 |
| 8,113,084 B2 * | 2/2012 | Yano | ....................... | G12B 5/00 324/750.22 |
| 9,032,832 B2 * | 5/2015 | Wu | ......................... | B25B 11/00 74/471 XY |
| 2004/0211285 A1 * | 10/2004 | Hunter | .................... | G03F 7/707 74/490.08 |
| 2010/0122603 A1 * | 5/2010 | Schubert | ............ | G03F 7/70716 74/490.08 |
| 2010/0242661 A1 * | 9/2010 | Mignano | .................... | B25J 5/04 74/490.08 |
| 2012/0279344 A1 * | 11/2012 | Hwang | ................. | G02B 7/005 74/490.08 |

* cited by examiner

*Primary Examiner* — David M Fenstermacher (57) ABSTRACT

A xyθ precision alignment platform is provided. The alignment platform includes three power units and three moving platform. Two of the power units can drive a third moving platform moving in X or Y direction. The other power unit has a worm which can drive an arcuate teeth arrangement disposed between the second moving platform and the third moving platform to drive the third moving platform rotating. Whereby, since the worm is arranged to drive the arcuate teeth arrangement laterally, the alignment platform is thin and the rotative movement of the third moving platform can be precisely controlled. Additionally, each power unit may be electrically connected to a controller for respectively driving and controlling each power unit. When only the rotation of the third moving platform is required, only one of the power units needs to be driven, thus simplifying the operation of the alignment platform and improving the work efficiency.

11 Claims, 11 Drawing Sheets

XYθ PRECISION ALIGNMENT PLATFORM

FIELD OF THE INVENTION

The present invention is a CIP of application Ser. No. 13/584,833, filed Aug. 14, 2012, the entire contents of which are hereby incorporated by reference.

BACKGROUND OF THE INVENTION

Description of the Prior Art

In a conventional alignment platform such as the ultrahigh load alignment device is disclosed in TW200912688. In TW200912688, the device uses three sets of driving devices to drive three sets of moving devices moving linearly so as to drive the moving plateform moving or rotating. When the rotation of the moving plateform is required, the three sets of driving devices must cooperate synchronously, which is uneasy to make the moving plateform move along a circular path precisely. As a result, as a controller or a computer drives the driving devices operating, the controller or the computer have to processing a great quantity of calculation, thus increasing the processing and response time and affecting the work efficiency.

To improve the defects like that in TW200912688, the inventor had invented an alignment stage applied for a TW patent application with application No. 099118614 which had been granted as TWI390144. The alignment stage includes three power units and three moving units. Two of the power units can drive a third moving unit moving in either of two different directions. The other power units can drive the third moving unit rotating individually. Each power unit is electrically connected to a controller for respectively driving and controlling each power unit. When only the rotation of the third moving platform is required, only one of the power units needs to be driven, thus simplifying the operation of the alignment platform and improving the work efficiency.

However, the inventor has been seeking a better alignment platform, and a xyθ precision alignment platform is provided in this application, to obviate or at least mitigate the above mentioned disadvantages.

SUMMARY OF THE INVENTION

An object of the present invention is to provide a xyθ precision alignment platform which can accurately and precisely control and adjust the rotation angle.

Another object of the present invention is to provide a xyθ precision alignment platform which can easily drive workpiece moving and rotating and simplify the operation.

Another object of the present invention is to provide a xyθ precision alignment platform which is thin.

To achieve the above and other objects, a xyθ precision alignment platform includes a base, at least one Y-axis guideway unit, a first moving platform, a first power unit, at least one X-axis guideway unit, a second moving platform, a second power unit, a third moving platform, a rotating unit and a third power unit. The at least one Y-axis guideway unit is mounted to the base. The first moving platform is movably coupled with each Y-axis guideway unit, the first moving platform and the base being parallel. The first power unit includes a first motor and a first rod member driven by the first motor, and the first motor is mounted to the base, wherein the first motor drives the first rod member moving to move the first moving platform along each Y-axis guideway unit move. The at least one X-axis guideway unit is co-movable with the first moving platform, and the X-axis guideway unit and the Y-axis guideway unit are nonparallel. The second moving platform is movably coupled with each X-axis guideway unit, and the second moving platform and the base are parallel. The second power unit includes a second motor and a second rod member driven by the second motor, and the second motor is mounted to one of the first moving platform, the first rod member and each X-axis guideway unit, wherein the second motor drives the second rod member to move the second moving platform along each X-axis guideway unit. The third moving platform is rotatably disposed correspondingly above the second moving platform, the third moving platform and the base parallel. The rotating unit is disposed between the second moving platform and the third moving platform and has a circumferential arcuate teeth arrangement. The third power unit is disposed by a lateral side of the second moving platform and includes a third motor and a worm driven by the third motor and engaged with the arcuate teeth arrangement, wherein the third motor drives the worm rotating to drive the arcuate teeth arrangement to move the third moving platform to rotate relative to the base.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

FIGS. 1 to 4 show a xyθ precision alignment platform according to a preferred embodiment of the present invention. The xyθ precision alignment platform includes a base 1, four Y-axis guideway units 2, a first moving platform 3, a first power unit 4, four X-axis guideway units 5, a second moving platform 6, a second power unit 7, four θ-angle guideway units 8, a third moving platform 9, a rotating unit 10 and a third power unit 11.

The base 1 is a plate body which can be adapted to dispose on a plane. The base 1 defines a longitudinal direction and a width direction, and may be formed with one or more recesses 12.

The Y-axis guideway units 2 are mounted to the base 1, and each Y-axis guideway unit 2 is engaged in each recess 12. The Y-axis guideway units 2 are parallel. Alternatively, only one Y-axis guideway unit 2 is mounted to the base 1.

The first moving platform 3 is movably coupled with the Y-axis guideway units 2 so that the first moving platform 3 is movable along the Y-axis guideway units 2. The first moving platform 3 and the base 1 are parallel. The first moving platform 3 may include a plate body 31 and at least one sliding block 32. Each sliding block 32 of each first moving platform 3 is mounted to the plate body 31 of the first moving platform 3 so that each sliding block 32 of each first moving platform 3 and the plate body 31 of the first moving platform 3 are in a cooperative relationship. The sliding blocks 32 of the first moving platform 3 are movably coupled with the Y-axis guideway unit 2, respectively. The plate body 31 of the first moving platform 3 is formed with at least one recess 311.

The first power unit 4 includes a first motor 41 and a first rod member 42 driven by the first motor 41. The first motor 41 is mounted to the base 1. The first motor 41 can drive the first rod member 42 moving, and the moving first rod member 42 can move the first moving platform 3 along the Y-axis guideway units 2.

The X-axis guideway units 5 are mounted to the first moving platform 3, or each X-axis guideway unit 5 can be engaged in each recess 311 so that each X-axis guideway unit 5 and first moving platform 3 are co-movable. Each X-axis guideway unit 5 and each Y-axis guideway unit 2 are nonparallel. Alternatively, only one X-axis guideway unit 5 is mounted to the first moving platform 3.

The second moving platform 6 is movably coupled with the X-axis guideway units 5 so that the second moving platform 6 is movable along the X-axis guideway units 5. The second moving platform 6 is preferably parallel to the base 1. The second moving platform 6 may include a plate body 61 and at least one sliding block 62. Each sliding block 62 of each second moving platform 6 is mounted to the plate body 61 of the second moving platform so that each sliding block 62 of the second moving platform 6 and the plate body 61 of the second moving platform are in a cooperative relationship. The sliding blocks 62 of the second moving platform 6 are movably coupled with the X-axis guideway units 5, respectively. The plate body 61 of the second moving platform 6 may further be formed with at least one groove 611.

Figure 1:
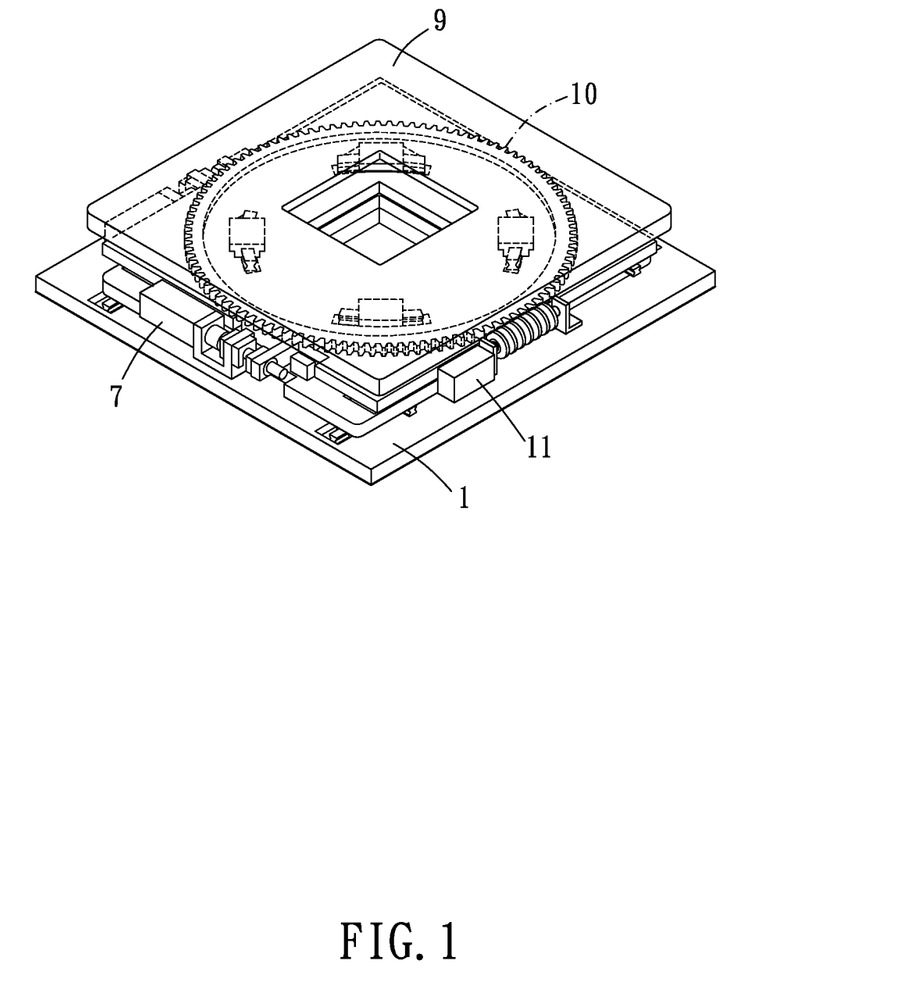
FIG. 1 is a perspective drawing according to a preferred embodiment of the present invention.
Figure 2:
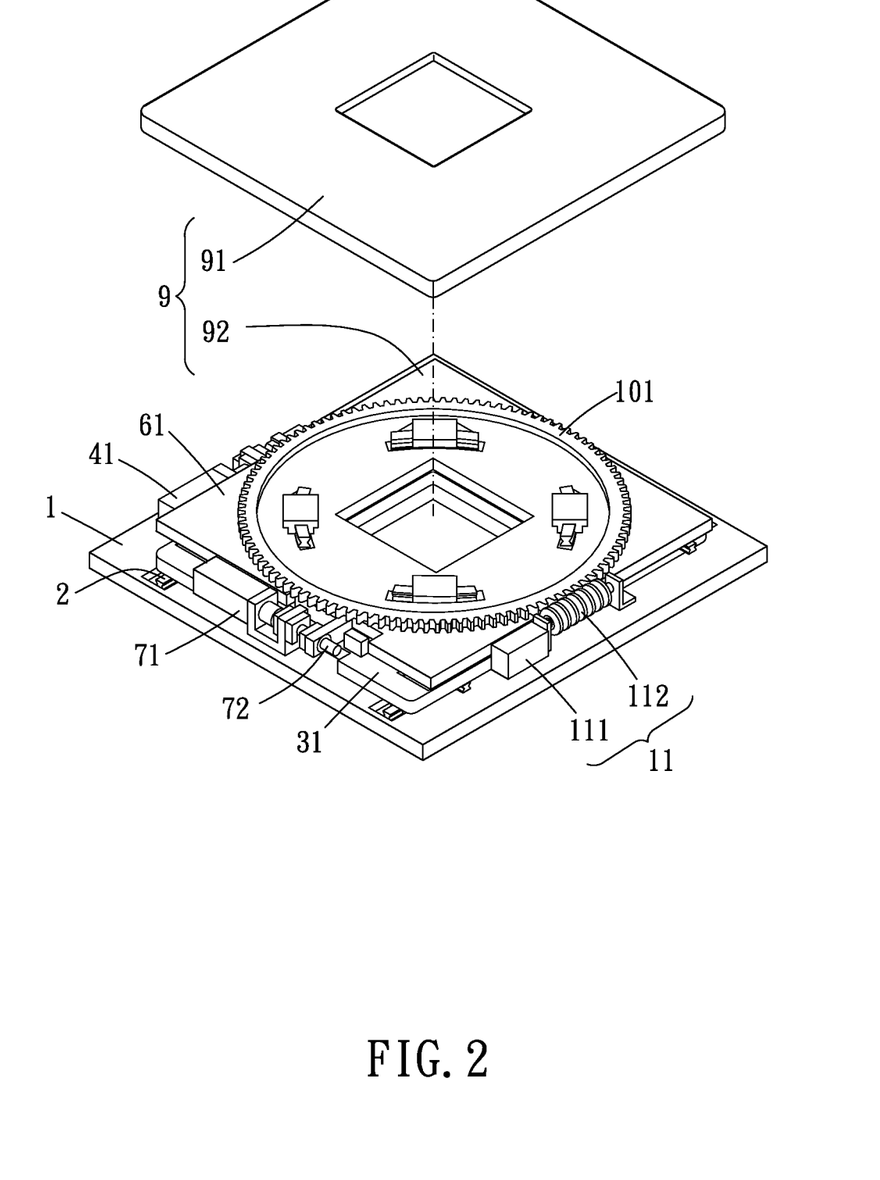
FIG. 2 is a partial breakdown drawing according to a preferred embodiment of the present invention.
Figure 3:
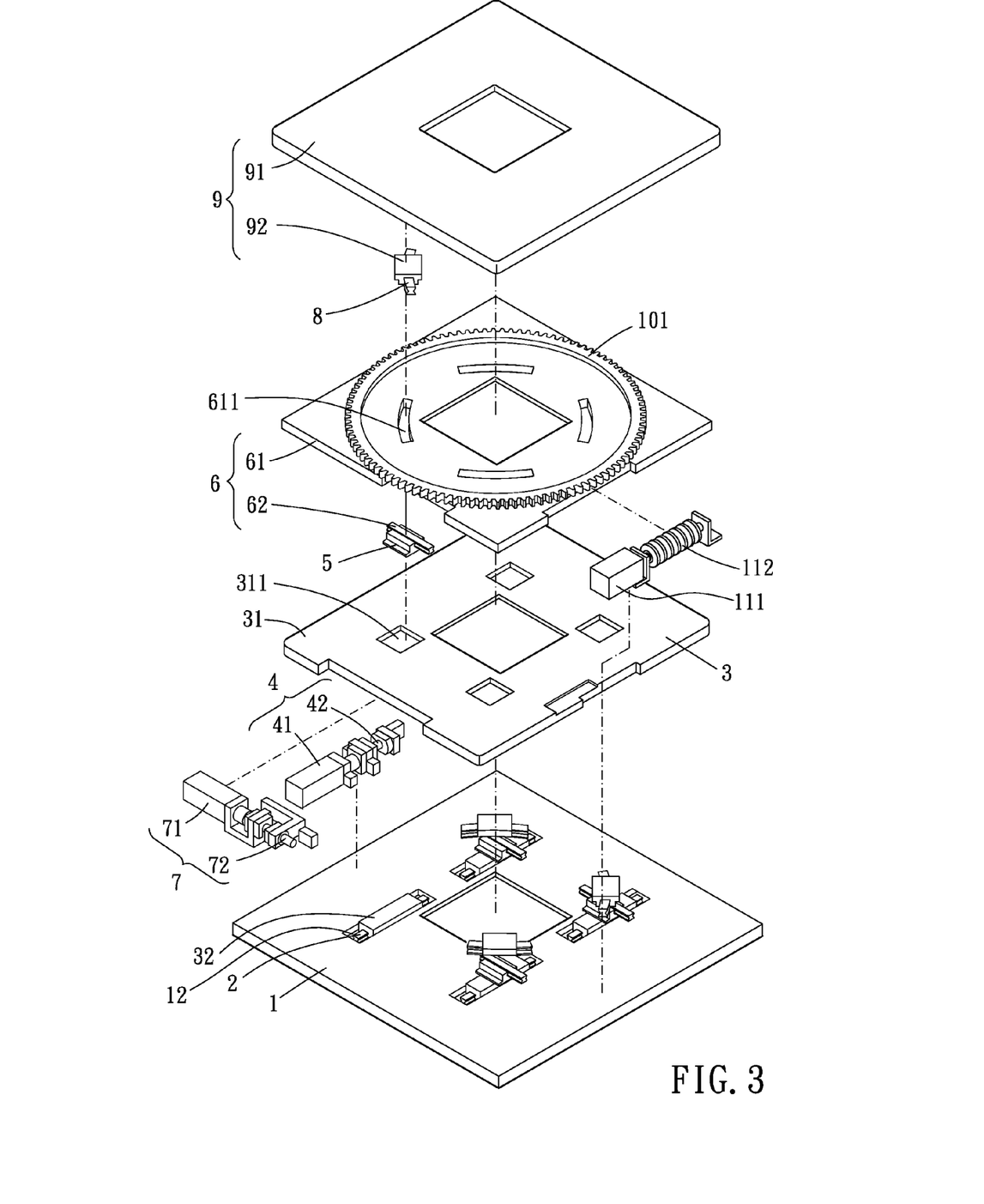
FIG. 3 is a perspective breakdown drawing according to a preferred embodiment of the present invention.
Figure 4:
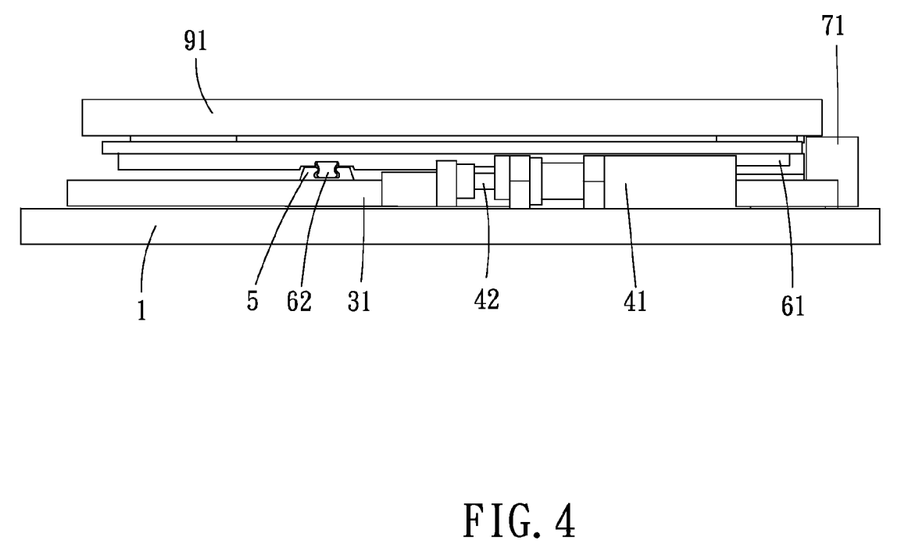
FIG. 4 is a side view according to a preferred embodiment of the present invention.
Figure 5:
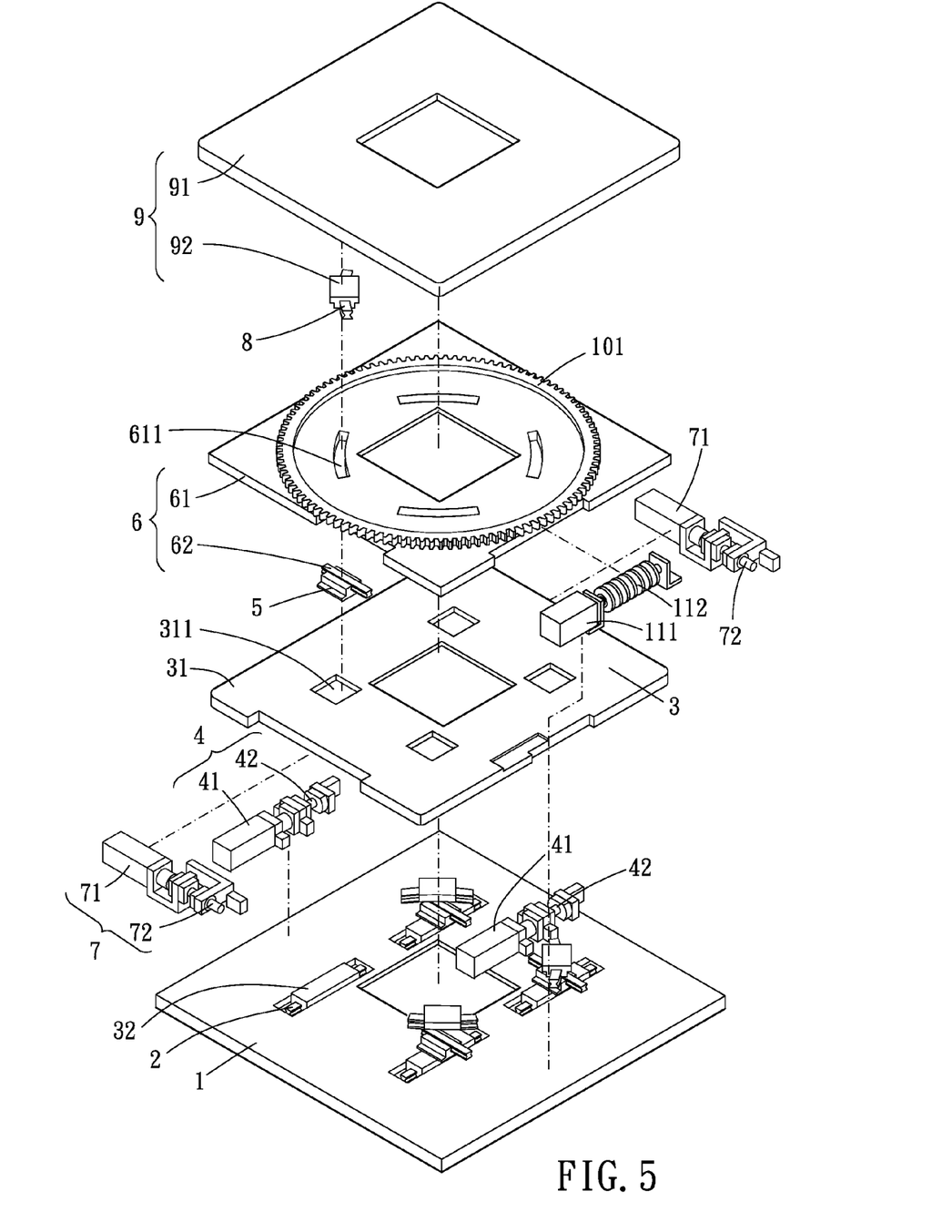
FIG. 5 is a perspective breakdown drawing showing an alignment platform having plural sets of first and second power units according to a preferred embodiment of the present invention.

The second power unit 7 includes a second motor 71 and a second rod member 72 driven by the second motor 71. The second motor 71 is mounted to the first moving platform 3. Specifically, the second motor 71 may be mounted to the plate body 31 of the first moving platform 3. In other embodiments, the second motor 71 may be mounted to the first rod member 42 or one of the X-axis guideway units 5 so that the first moving platform 3 can drive the second motor 71 moving synchronously. The second motor 71 can drive the second rod member 72 moving, and the moving second rod member 72 can move the second moving platform 6 along the X-axis guideway units 5. The second power unit 7 and the first power unit 4, respectively, drive the second moving platform 6 and the first moving platform 3 moving in different directions. The second rod member 72 and the first rod member 42 extend in different directions. As shown in FIG. 5, the first power unit 4 may include plural sets of first motor 41 and first rod member 42. The second power unit 7 may include plural sets of second motor 71 and second rod member 72. The first motors 41 and second motors 71 are disposed respectively by lateral sides of the base 1 and the first moving platform 3.

The θ-angle guideway units 8 are mounted to the second moving platform 6, or each θ-angle guideway unit 8 may be engaged in each groove 611 so that each θ-angle guideway unit 8 and the second moving platform 6 are in a cooperative relationship. The θ-angle guideway unit 8 is formed as an arced guiding track. Optionally, only one θ-angle guideway unit 8 is mounted to the second moving platform 6, or the θ-angle guideway unit may extend to form a circular member.

The third moving platform 9 is disposed correspondingly above the second moving platform 6 and coupled with the θ-angle guideway units 8 in such a manner that the third moving platform 9 is rotatable along the θ-angle guideway units 8. The third moving platform 9 and the base 1 are parallel. In this embodiment, the third moving platform 9 includes a plate body 91 and at least one sliding block 92. Each sliding block 92 of the third moving platform 9 is mounted to the plate body 91 of the third moving platform 9. The sliding blocks 92 of the third moving platform 9 are movably coupled with the θ-angle guideway units 8, respectively.

The rotating unit 10 is mounted between the second moving platform 6 and the third moving platform 9 and has a circumferential arcuate teeth arrangement 101. Specifically, the arcuate teeth arrangement 101 is formed as a circular teeth arrangement, and the arcuate teeth arrangement 101 is preferably disposed within the outermost edge of the third moving platform 9 so that the lateral dimension of the alignment platform is reduced. Corresponding to the base 1, a top surface of the rotating unit 10 is preferably not higher than a top surface of the third moving platform 9, and more preferably, lower than a bottom surface of the third moving platform 9 so that the base 1 and the third moving platform 9 are close to each other and the alignment platform is therefore thin. In addition, the rotating unit 10 may be disposed between the second moving platform 6 and the third moving platform 9 so that the rotating unit 10 can be well protected and is not easy to be interfered, accidentally contacted or damaged.

The third power unit 11 is disposed by a lateral side of the second moving platform 6 and includes a third motor 111 and a worm 112 driven by the third motor 111 and engaged with the arcuate teeth arrangement 101. The second moving platform 6 can drive the third motor 111, and the moving third motor 111 can drive the worm 112 rotating to drive the arcuate teeth arrangement 101 to move the third moving platform 9 along each θ-angle guideway unit 8 to rotate relative to the base 1.

Figure 6:
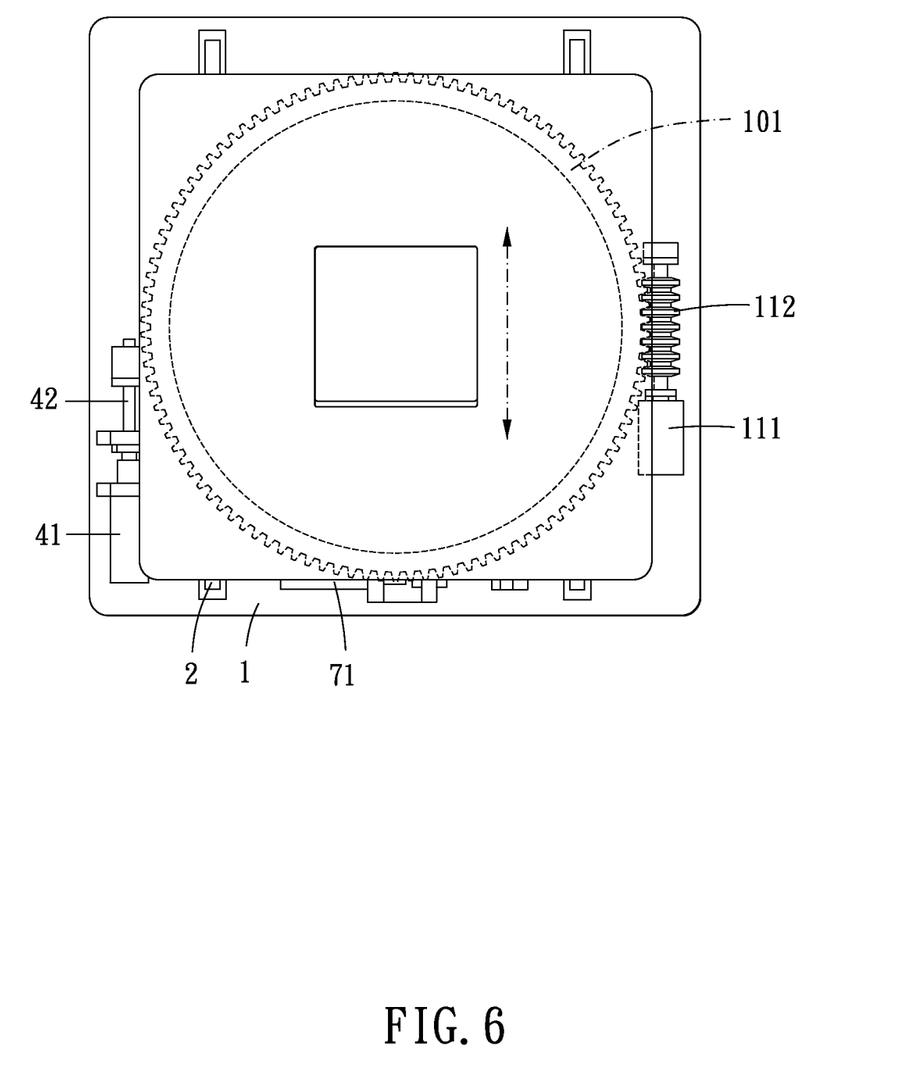
FIGS. 6 to 8 are drawings illustrating a xyθ precision alignment platform in use according to a preferred embodiment of the present invention.
Figure 7:
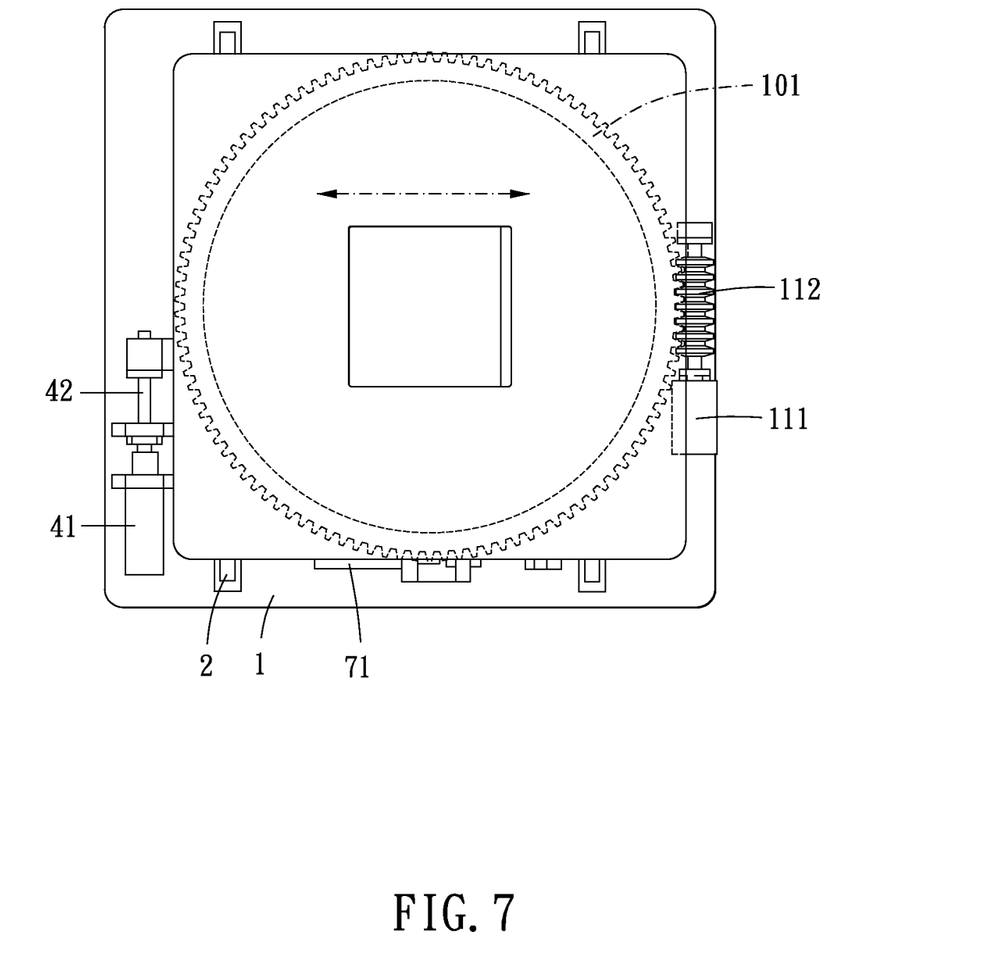
Figure 8:
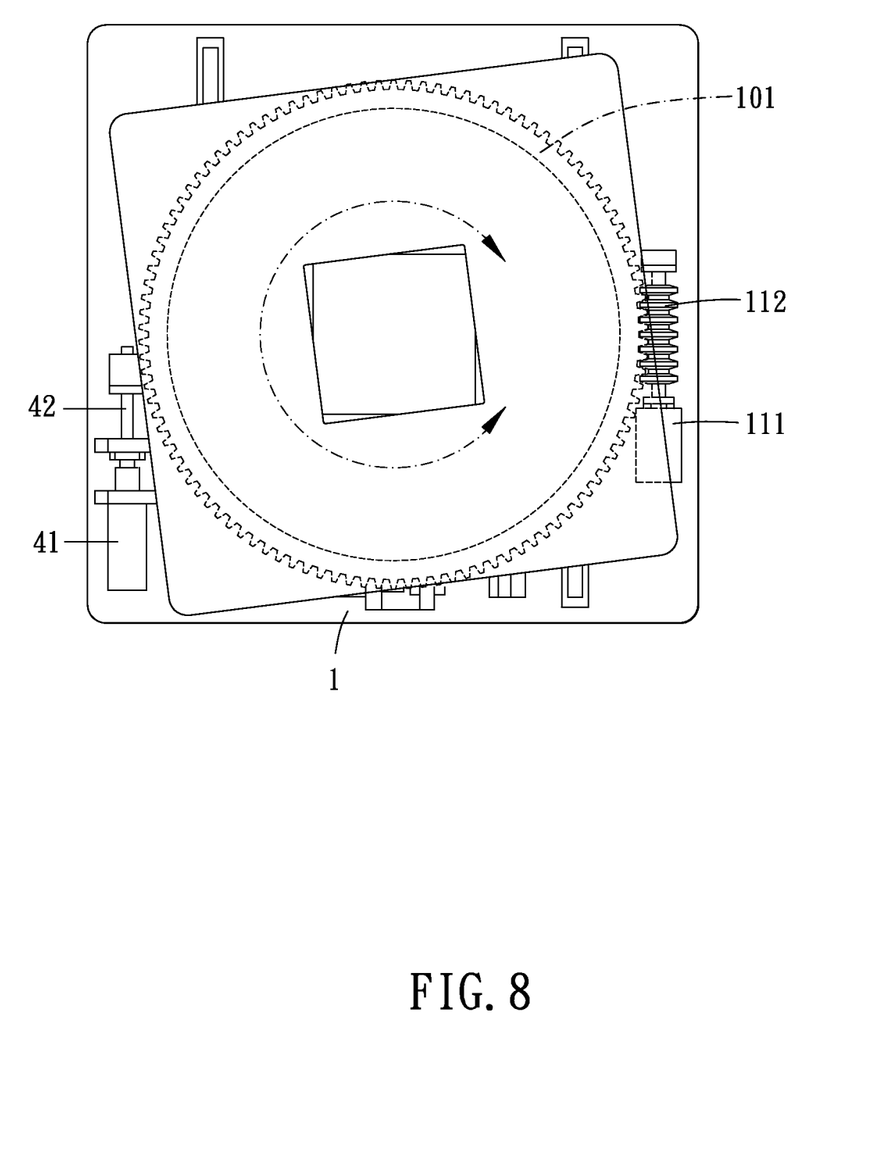

Please refer further to FIG. 6, as the first motor 41 rotates, the first moving platform 3 moves along the Y-axis guideway unit 2 and drives the X-axis guideway units 5 moving so as to move the second moving platform 6 and third moving platform 9 along Y-axis guideway unit 2. Please refer further to FIG. 7, as the second motor 71 rotates, the second moving platform 6 moves along the X-axis guideway unit 5 and drives the θ-angle guideway units 8 moving so as to move the third moving platform 9 along the X-axis guideway unit 5. Please refer further to FIG. 8, as the third motor 111 rotates, the worm 112 is driven to move the arcuate teeth arrangement 101 so that the third moving platform 9 can be driven to rotate along the θ-angle guideway units 8. Whereby, the third moving platform 9 is able to move along the Y-axis guideway unit 2, the X-axis guideway unit 5 or the θ-angle guideway units 8. When the third moving platform 9 is required to rotate, the first motor 41 and second motor 71 need not to be driven, thus resulting a simple operation and easing the work load of the controller and reducing response time of the controller.

Figure 9:
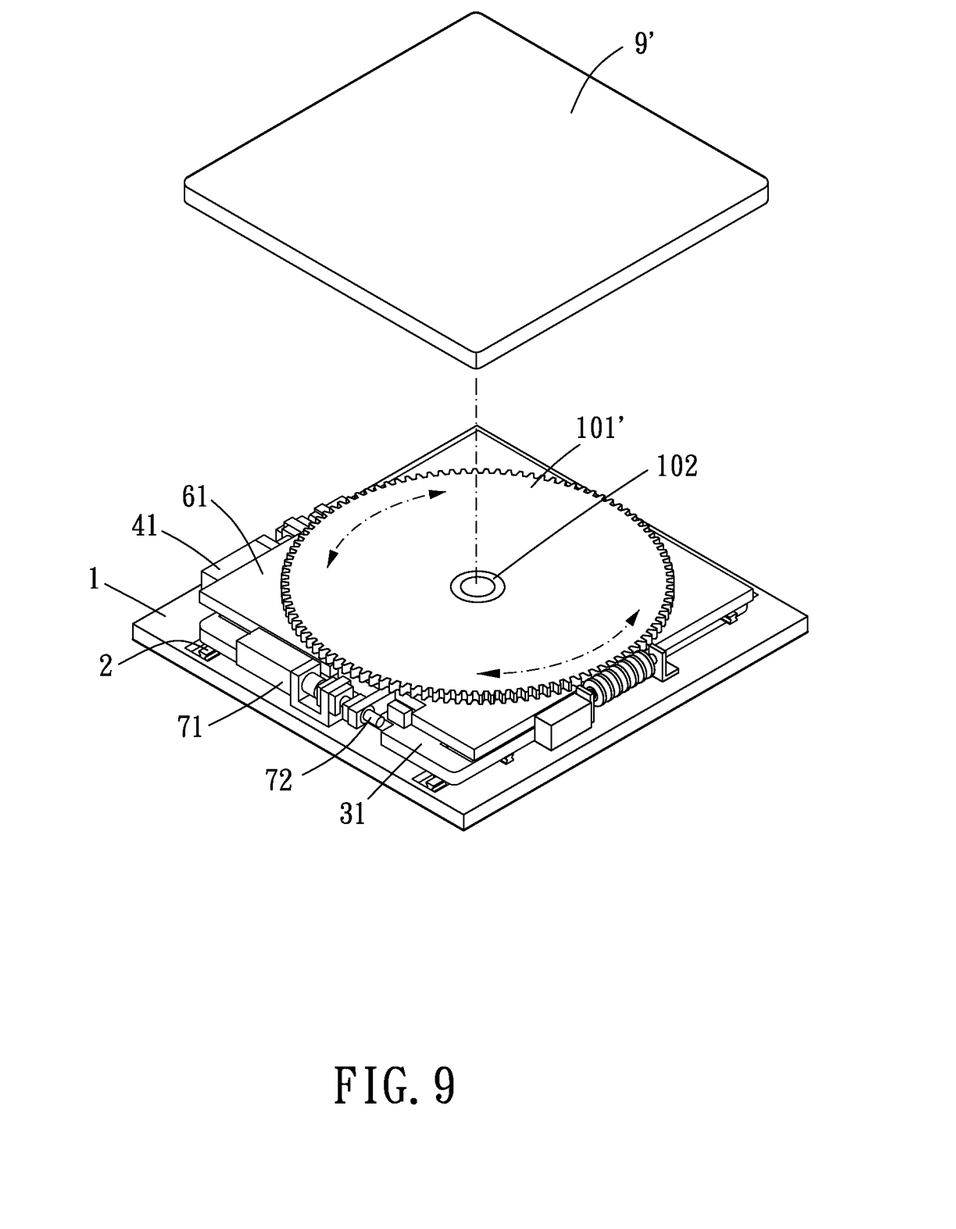
FIG. 9 is a partial breakdown drawing according to an alternative embodiment of the present invention.
Figure 10:
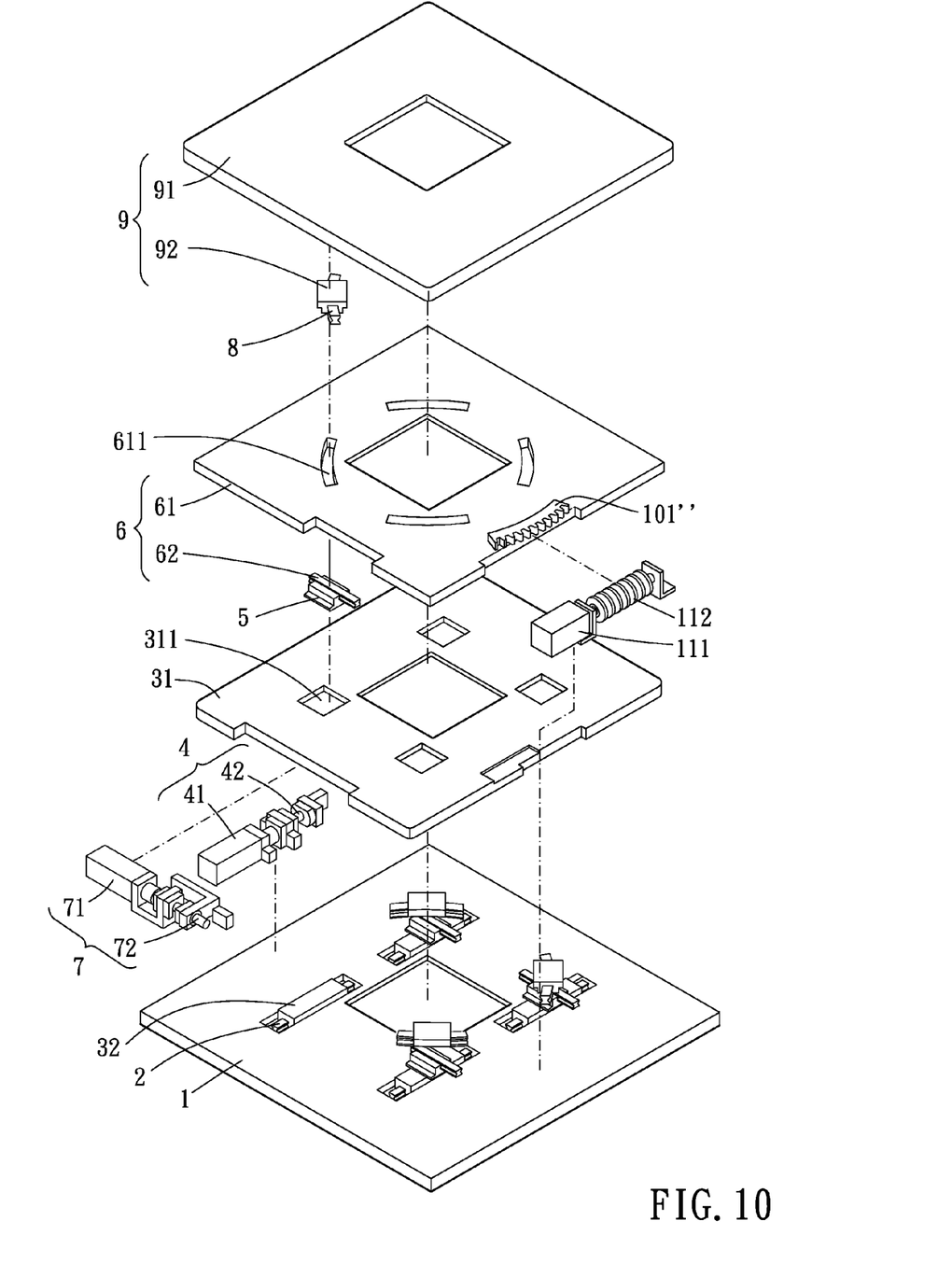
FIG. 10 is a breakdown drawing according to another embodiment of the present invention.
Figure 11:
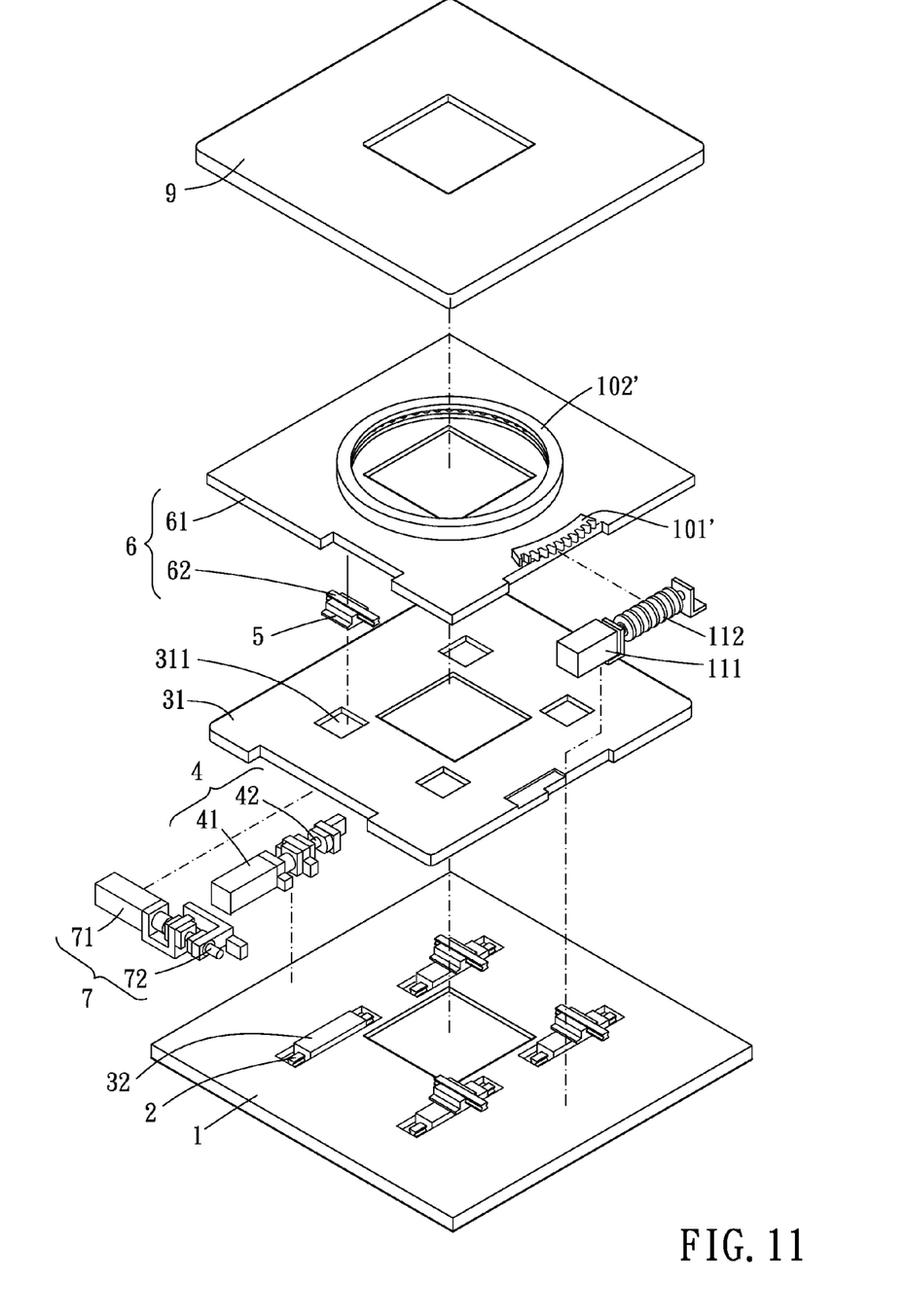
FIG. 11 is a breakdown drawing according to another embodiment of the present invention.

It is noted that, the alignment platform may be alternatively configured in a structure such as that shown in FIG. 9. As shown in FIG. 9, a rotating unit may include a bearing 102, wherein an arcuate teeth arrangement 101' of the rotating unit is formed as a circular teeth arrangement and around the bearing 102. The circular teeth arrangement and a third moving platform 9' are cooperative with each other, and the circular teeth arrangement is rotatable around the bearing 102. In aforementioned embodiment, each plate body is a quadrilateral hollow plate body; however, each plate body may be a quadrilateral solid plate body (for example, the third moving platform 9' arranged as the top plate). Optionally, as shown in FIG. 10, an arcuate teeth arrangement 101" is noncircular and a part of a circular teeth arrangement, wherein the extent of the arcuate teeth arrangement 101" may be designed according various requirements or may be constructed by plural arcuate tooth parts separately arranged. Alternatively, as shown in FIG. 10, a bearing 102' is disposed between the second moving platform 6 and the third moving platform 9.

It is noted that, an optical ruler may be equipped to the alignment platform, which can improve the control of rotation angle and the precision of measurement and digitalize the rotation angle with small scale for reference. As a result, the user can accurately and precisely control and adjust the rotation angle accordingly, and the alignment platform can be applied to tasks requiring high precision such as to assemble miniature parts or to machine processing or etching.

In the present invention, through the cooperation of the worm and the arcuate teeth arrangement, every circle of rotation of the worm can cause the arcuate teeth arrange rotatively travel with only for a tooth-wide distance, thus avoiding the unenablement of fine adjustment of the third moving platform due to the fast rotation speed of the third motor, and achieving accurate and precise control and adjustment of the rotation angle of the alignment platform.

Furthermore, in the present invention, since each motor is disposed by the lateral side of the first moving platform or the second moving platform, each motor and each moving platform are stacked so that the alignment platform is thin.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A xyθ precision alignment platform, including:
   a base;
   at least one Y-axis guideway unit, mounted to the base;
   a first moving platform, movably coupled with each Y-axis guideway unit, the first moving platform and the base being parallel;
   a first power unit, including a first motor and a first rod member driven by the first motor, the first motor mounted to the base, wherein the first motor drives the first rod member moving to move the first moving platform along each Y-axis guideway unit move;
   at least one X-axis guideway unit, co-movable with the first moving platform, the X-axis guideway unit and the Y-axis guideway unit be nonparallel;
   a second moving platform, movably coupled with each X-axis guideway unit, the second moving platform and the base parallel;
   a second power unit, including a second motor and a second rod member driven by the second motor, the second motor mounted to one of the first moving platform, the first rod member and each X-axis guideway unit, wherein the second motor drives the second rod member to move the second moving platform along each X-axis guideway unit;
   a third moving platform, rotatably disposed correspondingly above the second moving platform, the third moving platform and the base parallel;
   a rotating unit, disposed between the second moving platform and the third moving platform, having a circumferential arcuate teeth arrangement; and
   a third power unit, disposed by a lateral side of the second moving platform, including a third motor and a worm driven by the third motor and engaged with the arcuate teeth arrangement, wherein the third motor drives the worm rotating to drive the arcuate teeth arrangement to move the third moving platform to rotate relative to the base.

2. The xyθ precision alignment platform of claim 1, wherein corresponding to the base, a top surface of the third moving platform is higher than a top surface of the rotating unit.

3. The xyθ precision alignment platform of claim 1, wherein the rotating unit further includes a bearing, the arcuate teeth arrangement is a circular teeth arrangement around the bearing, the circular teeth arrangement and the third moving platform are co-movable, and the circular teeth arrangement is rotatable about the bearing.

4. The xyθ precision alignment platform of claim 1, wherein the arcuate teeth arrangement is noncircular and a part of a circular teeth arrangement.

5. The xyθ precision alignment platform of claim 1, further including a plurality of θ-angle guideway units mounted to the second moving platform, and each θ-angle guideway unit is an arced guiding track.

6. The xyθ precision alignment platform of claim 5, wherein the base is formed with at least one recess, each Y-axis guideway unit is engaged in each recess, the first moving platform includes a plate body, the plate body of the first moving platform is formed with at least one recess, each X-axis guideway unit engaged in each recess, the second moving platform includes a plate body, the plate body of the second moving platform is formed with at least one groove, and each θ-angle guideway unit is engaged in each groove.

7. The xyθ precision alignment platform of claim 6, wherein the third moving platform includes a plate body and a sliding block, and the θ-angle guideway unit is a circular track.

8. The xyθ precision alignment platform of claim 7, wherein the sliding block is rotatably coupled to an inner circumferential surface of the circular track.

9. The xyθ precision alignment platform of claim 1, wherein the first power unit includes plural sets of the first motor and first rod member, the second power unit includes plural sets of second motor and second rod member, the first motors and second motors are disposed respectively by lateral sides of the base and the first moving platform.

10. The xyθ precision alignment platform of claim 7, wherein each plate body is a quadrilateral solid plate body.

11. The xyθ precision alignment platform of claim 7, wherein each plate body is a quadrilateral hollow plate body.

* * * * *